United States Patent
Lau et al.

(10) Patent No.: US 11,665,832 B2
(45) Date of Patent: May 30, 2023

(54) CIRCUIT BOARD STRUCTURE AND MANUFACTURING METHOD THEREOF

(71) Applicant: Unimicron Technology Corp., Taoyuan (TW)

(72) Inventors: John Hon-Shing Lau, Taoyuan (TW); Cheng-Ta Ko, Taipei (TW); Pu-Ju Lin, Hsinchu (TW); Chi-Hai Kuo, Taoyuan (TW); Kai-Ming Yang, Hsinchu County (TW); Chia-Yu Peng, Taoyuan (TW); Shao-Chien Lee, Taipei (TW); Tzyy-Jang Tseng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/234,805

(22) Filed: Apr. 20, 2021

(65) Prior Publication Data

US 2022/0256717 A1 Aug. 11, 2022

(30) Foreign Application Priority Data

Feb. 8, 2021 (TW) .................................. 110104623

(51) Int. Cl.
*H05K 1/00* (2006.01)
*H05K 1/02* (2006.01)
(Continued)

(52) U.S. Cl.
CPC .............. *H05K 3/46* (2013.01); *H05K 3/022* (2013.01); *H05K 3/386* (2013.01); *H05K 3/4038* (2013.01)

(58) Field of Classification Search
CPC .. H05K 1/00; H05K 1/02; H05K 1/03; H05K 1/09; H05K 1/11; H05K 1/14; H05K 1/16;
(Continued)

(56) References Cited

U.S. PATENT DOCUMENTS 6,329,610 B1 * 12/2001 Takubo ................ H05K 3/4691
174/255
6,768,064 B2 7/2004 Higuchi et al.
(Continued)

FOREIGN PATENT DOCUMENTS

TW 201141342 11/2011
TW 201946515 12/2019

OTHER PUBLICATIONS

"Office Action of Taiwan Counterpart Application", dated Aug. 18, 2021, p. 1-p. 11.

*Primary Examiner* — Xiaoliang Chen
(74) *Attorney, Agent, or Firm* — JCIPRNET

(57) ABSTRACT

A circuit board structure includes a first sub-board including a plurality of circuit patterns, a second sub-board including a plurality of pads, and a connecting structure layer having a plurality of through holes and including an insulating layer, first and second adhesive layers, and a plurality of conductive blocks. The first adhesive layer is directly connected to the first sub-board. The second adhesive layer is directly connected to the second sub-board. The through holes penetrate through the first adhesive layer, the insulating layer, and the second adhesive layer. The conductive blocks are located in the through holes. An upper surface and a lower surface of each conductive block are respectively lower than a first surface of the first adhesive layer and a second surface of the second adhesive layer relatively away from the insulating layer. Each circuit pattern contacts the upper surface, and each pad contacts the lower surface.

6 Claims, 4 Drawing Sheets

(51) Int. Cl.
  *H05K 1/03* (2006.01)
  *H05K 1/09* (2006.01)
  *H05K 1/11* (2006.01)
  *H05K 1/14* (2006.01)
  *H05K 1/16* (2006.01)
  *H05K 1/18* (2006.01)
  *H05K 3/20* (2006.01)
  *H05K 3/36* (2006.01)
  *H05K 3/38* (2006.01)
  *H05K 3/40* (2006.01)
  *H05K 3/46* (2006.01)
  *H05K 3/02* (2006.01)

(58) Field of Classification Search
  CPC .......... H05K 1/18; H05K 1/111; H05K 1/113;
    H05K 1/115; H05K 1/182; H05K 3/20;
    H05K 3/36; H05K 3/38; H05K 3/40;
    H05K 3/46; H05K 3/368; H05K 3/386;
    H05K 3/4038; H05K 3/4623
  USPC ....... 174/255, 250, 254, 258, 259, 260, 264;
    361/761, 771, 783
  See application file for complete search history.

(56) References Cited

U.S. PATENT DOCUMENTS

| | | | | |
|---|---|---|---|---|
| 2001/0005545 A1* | 6/2001 | Andou | ............... | H05K 3/462 |
| | | | | 428/209 |
| 2002/0020548 A1* | 2/2002 | Takenaka | ............ | H05K 3/4614 |
| | | | | 174/262 |
| 2002/0066961 A1* | 6/2002 | Tomekawa | ......... | H05K 3/4069 |
| | | | | 257/776 |
| 2002/0134584 A1* | 9/2002 | Higuchi | ............... | H05K 3/4617 |
| | | | | 174/262 |
| 2003/0168254 A1* | 9/2003 | Kariya | ............... | H01L 25/0657 |
| | | | | 257/E21.705 |
| 2005/0057906 A1* | 3/2005 | Nakatani | ............ | H05K 3/321 |
| | | | | 29/830 |
| 2005/0155792 A1* | 7/2005 | Ito | ............... | H05K 3/4617 |
| | | | | 29/852 |
| 2007/0221399 A1* | 9/2007 | Nishizawa | ......... | H01L 24/97 |
| | | | | 174/250 |
| 2009/0020319 A1* | 1/2009 | Yamada | ............ | H05K 3/4617 |
| | | | | 174/255 |
| 2010/0315796 A1* | 12/2010 | Sakuyama | ......... | H05K 1/115 |
| | | | | 361/783 |
| 2011/0100690 A1* | 5/2011 | Yoshimura | ......... | H05K 3/3485 |
| | | | | 252/512 |
| 2011/0303444 A1* | 12/2011 | Yoshimura | ......... | H05K 3/4623 |
| | | | | 174/250 |
| 2012/0055706 A1* | 3/2012 | Mok | ............... | H05K 1/162 |
| | | | | 29/25.41 |
| 2013/0126221 A1* | 5/2013 | Kanda | ............... | H05K 1/113 |
| | | | | 156/182 |
| 2013/0153269 A1* | 6/2013 | Takahashi | ......... | H05K 3/368 |
| | | | | 174/250 |
| 2015/0245474 A1* | 8/2015 | Takahashi | ......... | H05K 1/0278 |
| | | | | 361/761 |
| 2016/0021753 A1* | 1/2016 | Tomikawa | ......... | H05K 3/4697 |
| | | | | 361/761 |
| 2016/0295707 A1* | 10/2016 | Takano | ............... | H05K 1/115 |
| 2018/0218972 A1* | 8/2018 | Arai | ............... | H01L 21/486 |
| 2019/0289715 A1* | 9/2019 | Iwai | ............... | H01L 21/486 |
| 2020/0066624 A1* | 2/2020 | Chou | ............... | H01L 23/49816 |
| 2020/0328266 A1 | 10/2020 | Liu et al. | | |
| 2020/0389969 A1* | 12/2020 | Ikeda | ............... | H05K 1/025 |

\* cited by examiner

CIRCUIT BOARD STRUCTURE AND MANUFACTURING METHOD THEREOF

CROSS-REFERENCE TO RELATED APPLICATION

This application claims the priority benefit of Taiwan application serial no. 110104623, filed on Feb. 8, 2021. The entirety of the above-mentioned patent application is hereby incorporated by reference herein and made a part of this specification.

BACKGROUND

Technical Field

The disclosure relates to a substrate structure and a manufacturing method thereof, and in particular, relates to a circuit board structure and a manufacturing method thereof.

Description of Related Art

Generally, two circuit boards having circuits or conductive structures are connected to each other through a solderless block to be combined, and an underfill is used to fill the gap between the two substrates to seal the solderless block. Nevertheless, in the high-temperature reflow soldering process of the solder, the circuit board with the larger area size may not be released due to stress, so considerable warpage may easily occur, and the assembly yield between the two circuit boards may be reduced.

SUMMARY

The disclosure provides a circuit board structure requiring reduced costs and exhibiting favorable structural reliability without the use of solder and underfill.

The disclosure provides a manufacturing method of a circuit board structure configured to manufacture the above-mentioned circuit board structure.

A circuit board structure provided by the disclosure includes a first sub-board, a second sub-board, and a connecting structure layer. The first sub-board includes a plurality of circuit patterns. The second sub-board includes a plurality of pads. The connecting structure layer is disposed between the first sub-board and the second sub-board. The connecting structure layer has a plurality of through holes and includes an insulating layer, a first adhesive layer, a second adhesive layer, and a plurality of conductive blocks. The first adhesive layer and the second adhesive layer are located on two opposite sides of the insulating layer. The first adhesive layer is directly connected to the first sub-board, and the second adhesive layer is directly connected to the second sub-board. The through holes penetrate through the first adhesive layer, the insulating layer, and the second adhesive layer, and the conductive blocks are located in the through holes. An upper surface and a lower surface of each of the conductive blocks are respectively lower than a first surface of the first adhesive layer relatively away from the insulating layer and a second surface of the second adhesive layer relatively away from the insulating layer. Each of the circuit patterns contacts the upper surface of each of the conductive blocks, and each of the pads contacts the lower surface of each of the conductive blocks.

In an embodiment of the disclosure, a height of each of the conductive blocks is equal to or greater than a thickness of the insulating layer.

In an embodiment of the disclosure, the first sub-board includes a dielectric layer, a first circuit layer, a second circuit layer, and a plurality of conductive vias. The first circuit layer and the second circuit layer are located on two opposite sides of the dielectric layer. The conductive vias penetrate through the dielectric layer and are connected to the first circuit layer and the second circuit layer, and the second circuit layer includes the circuit patterns.

In an embodiment of the disclosure, the first sub-board includes a plurality of dielectric layers, a plurality of circuit layers, and a plurality of conductive vias. The circuit layers and the dielectric layers are stacked in an alternating manner. The conductive vias penetrate through the dielectric layers and are connected to the circuit layers. One layer among the circuit layers relatively adjacent to the connecting structure layer includes the circuit patterns, and at least one layer among the circuit layers includes a plurality of fine circuits.

In an embodiment of the disclosure, the second sub-board further includes a substrate, and the pads are located on a top surface of the substrate.

In an embodiment of the disclosure, the substrate includes a printed circuit board, a bismaleimide-triazine (BT) carrier board, a ceramic substrate, a redistribution layer (RDL) carrier board, or a glass substrate.

A manufacturing method of a circuit board structure provided by the disclosure includes the following steps. An insulating layer, a first adhesive layer, and a second adhesive layer are provided. The first adhesive layer and the second adhesive layer are located on two opposite sides of the insulating layer. A plurality of through holes are formed to penetrate through the first adhesive layer, the insulating layer, and the second adhesive layer. A plurality of conductive blocks are formed in the through holes to form a connecting structure layer. An upper surface and a lower surface of each of the conductive blocks are respectively lower than a first surface of the first adhesive layer relatively away from the insulating layer and a second surface of the second adhesive layer relatively away from the insulating layer. A first sub-board and a second sub-board are provided on two opposite sides of the connecting structure layer. The first sub-board includes a plurality of circuit patterns, and the second sub-board includes a plurality of pads. The first sub-board, the connecting structure layer, and the second sub-board are pressed such that the first adhesive layer is directly connected to the first sub-board, and the second adhesive layer is directly connected to the second sub-board. Each of the circuit patterns contacts the upper surface of each of the conductive blocks, and each of the pads contacts the lower surface of each of the conductive blocks.

In an embodiment of the disclosure, the manufacturing method of the circuit board structure further includes the following step. First tape and second tape are respectively provided on the first adhesive layer and the second adhesive layer after the insulating layer, the first adhesive layer, and the second adhesive layer are provided and before the through holes are formed. The through holes are allowed to penetrate through the first tape and the second tape when the through holes are formed. The first tape and the second tape are removed after the conductive blocks are formed in the through holes.

In an embodiment of the disclosure, a height of each of the conductive blocks is equal to or greater than a thickness of the insulating layer.

In an embodiment of the disclosure, the first sub-board includes a dielectric layer, a first circuit layer, a second circuit layer, and a plurality of conductive vias. The first circuit layer and the second circuit layer are located on two opposite sides of the dielectric layer. The conductive vias penetrate through the dielectric layer and are connected to the first circuit layer and the second circuit layer, and the second circuit layer includes the circuit patterns.

In an embodiment of the disclosure, the first sub-board includes a plurality of dielectric layers, a plurality of circuit layers, and a plurality of conductive vias. The circuit layers and the dielectric layers are stacked in an alternating manner. The conductive vias penetrate through the dielectric layers and are connected to the circuit layers. One layer among the circuit layers relatively adjacent to the connecting structure layer includes the circuit patterns, and at least one layer among the circuit layers includes a plurality of fine circuits.

In an embodiment of the disclosure, the second sub-board further includes a substrate, and the pads are located on a top surface of the substrate.

In an embodiment of the disclosure, the substrate includes a printed circuit board, a bismaleimide-triazine (BT) carrier board, a ceramic substrate, a redistribution layer (RDL) carrier board, or a glass substrate.

To sum up, in the circuit board structure design provided by the disclosure, the first adhesive layer of the connecting structure layer may be directly connected to the first sub-board including plural circuit patterns, the second adhesive layer of the connecting structure layer may be directly connected to the second sub-board including plural pads, and two opposite sides of the conductive blocks of the connecting structure layer may contact the circuit patterns and the pads. In this way, in the manufacturing method of the circuit board structure provided by the disclosure, neither solder nor underfill is required, so manufacturing costs of the circuit board structure may be effectively reduced. Besides, because the adhesive layers are used to replace the use of solder, the bonding yields between the connecting structure layer and the first sub-board and the second sub-board may be effectively increased, a simple process is provided, and structural reliability of the circuit board structure provided by the disclosure is improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1F are cross-sectional schematic views of a manufacturing method of a circuit board structure according to an embodiment of the disclosure. In the manufacturing method of the circuit board structure provided by the present embodiment, first, with reference to FIG. 1A, an insulating layer 112, a first adhesive layer 114, and a second adhesive layer 116 are provided. The first adhesive layer 114 and the second adhesive layer 116 are located on two opposite sides of the insulating layer 112 and are directly disposed on the insulating layer 112. Herein, a material of the insulating layer 112 is, for example, polyimide (PI), polypropylene (PP), ajinomoto build-up film (ABF) resin, bismaleimide-triazine (BT), or polyethylene terephthalate (PET).

Figure 1A:
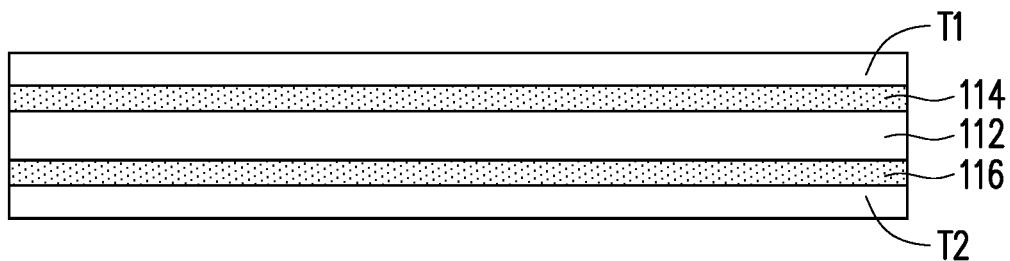
FIG. 1A to FIG. 1F are cross-sectional schematic views of a manufacturing method of a circuit board structure according to an embodiment of the disclosure.

Next, with reference to FIG. 1A, first tape T1 and second tape T2 are respectively provided on the first adhesive layer 114 and the second adhesive layer 116. The first tape T1 and the second tape T2 directly contact the first adhesive layer 114 and the second adhesive layer 116 respectively to be used as supporting layers.

Figure 1B:
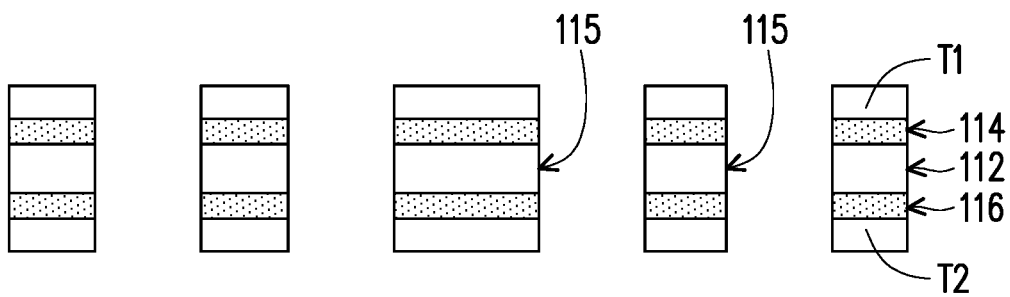

Next, with reference to FIG. 1B, a plurality of through holes (four through holes 115 are schematically shown) are formed to penetrate through the first tape T1, the first adhesive layer 114, the insulating layer 112, the second adhesive layer 116, and the second tape T2. Herein, the through holes 115 are formed through, for example, mechanical drilling or laser drilling, and the positions of the through holes 115 are the positions for subsequent connection.

Figure 1C:
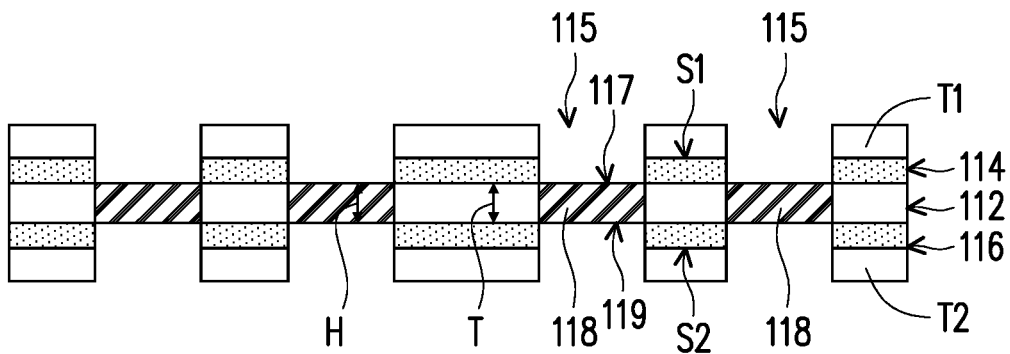

Next, with reference to FIG. 1C, a plurality of conductive blocks (four conductive blocks 118 are schematically shown) are formed in the through holes 115. The method of forming the conductive blocks 118 is, but not limited to, a low-temperature conductive paste printing method, for example. In particular, an upper surface 117 and a lower surface 119 of each of the conductive blocks 118 are respectively lower than a first surface S1 of the first adhesive layer 114 relatively away from the insulating layer 112 and a second surface S2 of the second adhesive layer 116 relatively away from the insulating layer 112. Preferably, a height H of each of the conductive blocks 118 is equal to or greater than a thickness T of the insulating layer 112.

Figure 1D:
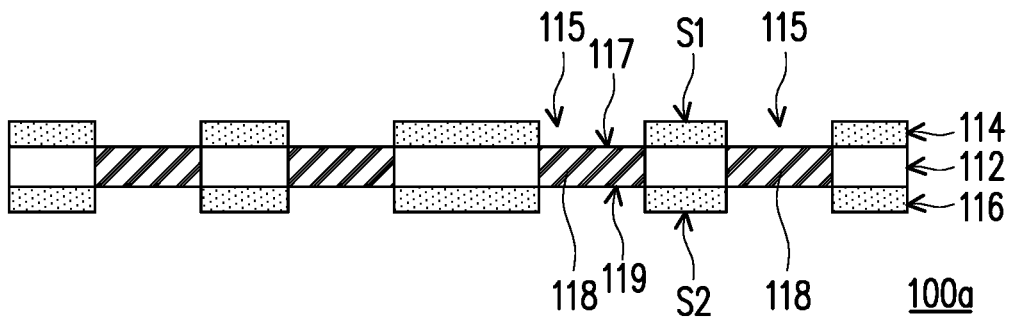

Next, with reference to FIG. 1D, the first tape T1 and the second tape T2 are removed to form a connecting structure layer 100a. Manufacturing of the connecting structure layer 100a is completed so far. Herein, the connecting structure layer 100a has the through holes 115 and includes the insulating layer 112, the first adhesive layer 114, the second adhesive layer 116, and the conductive blocks 118. The first adhesive layer 114 and the second adhesive layer 116 are located on two opposite sides of the insulating layer 112. The through holes 115 penetrate through the first adhesive layer 114, the insulating layer 112, and the second adhesive layer 116, and the conductive blocks 118 are located in the through holes 115. The upper surface 117 and the lower surface 119 of each of the conductive blocks 118 are respectively lower than the first surface S1 of the first adhesive layer 114 and the second surface S2 of the second adhesive layer 116.

Figure 1E:
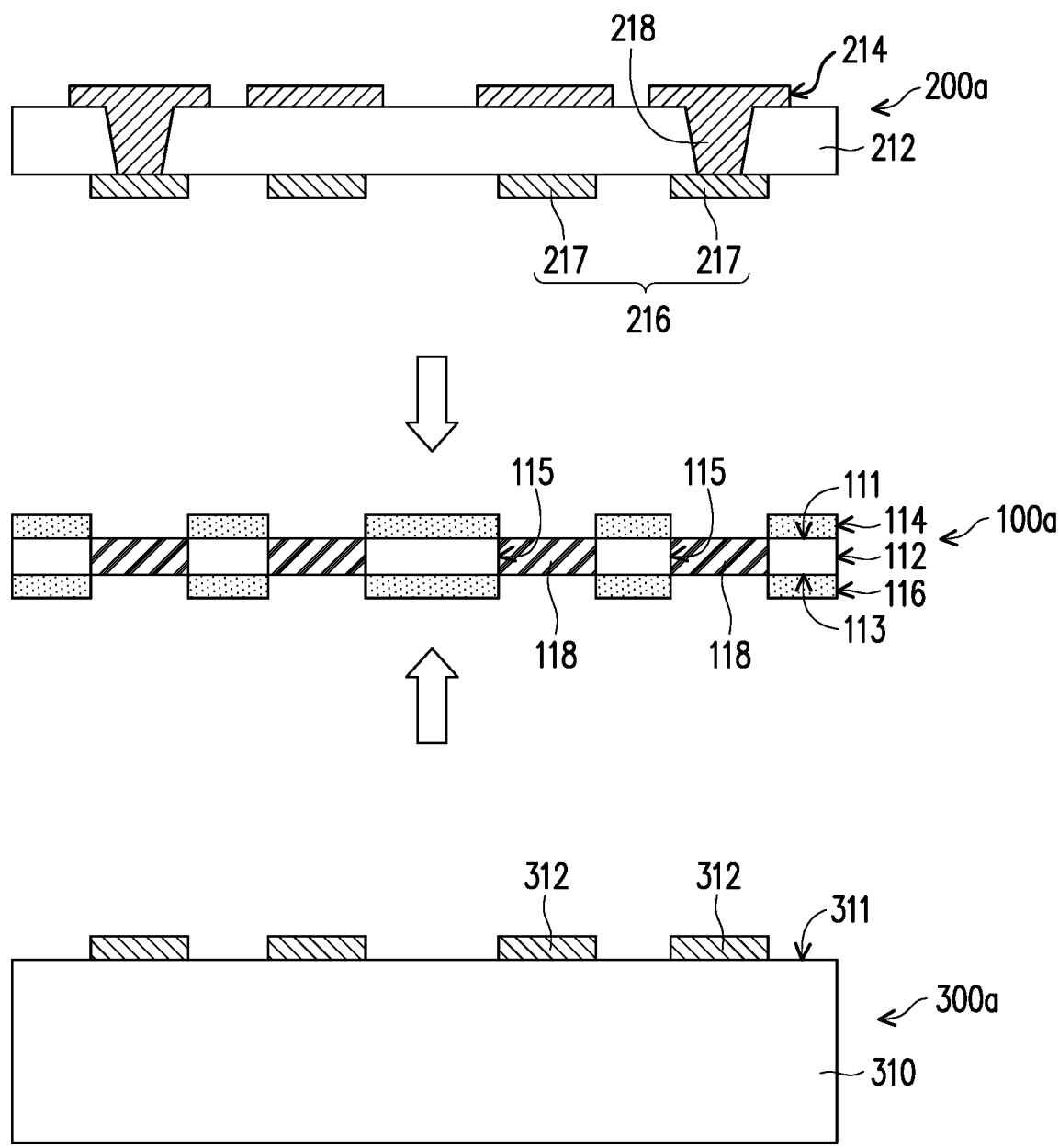

Next, with reference to FIG. 1E, a first sub-board 200a and a second sub-board 300a are provided on two opposite sides of the connecting structure layer 100a. The first sub-board 200a includes a plurality of circuit patterns 217, and the second sub-board 300a includes a plurality of pads 312. To be specific, the first sub-board 200a includes a dielectric layer 212, a first circuit layer 214, a second circuit layer 216, and a plurality of conductive vias 218. The first circuit layer 214 and the second circuit layer 216 are located on two opposite sides of the dielectric layer 212. The conductive vias 218 penetrate through the dielectric layer 212 and are connected to the first circuit layer 214 and the second circuit layer 216, and the second circuit layer 216 includes the circuit patterns 217. The second sub-board 300a further includes a substrate 310, and the pads 312 are located on a top surface 311 of the substrate 310. Herein, the substrate 310 is, but not limited to, a printed circuit board, for example. In an embodiment that is not shown, the substrate may also be a bismaleimide-triazine carrier board, a ceramic substrate, a redistribution layer carrier board, or a glass substrate, which still falls within the protection scope of the disclosure.

Figure 1F:
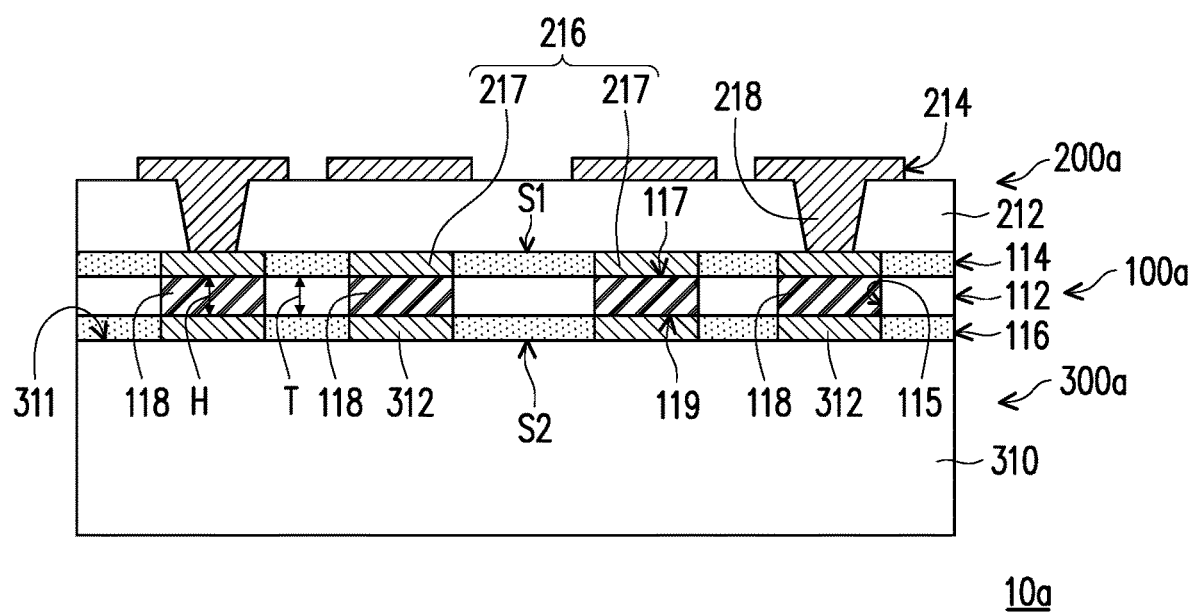

Finally, with reference to FIG. 1E and FIG. 1F together, the first sub-board 200a, the connecting structure layer 100a, and the second sub-board 300a are pressed through pressurization and heating, such that the first adhesive layer 114 is directly connected to the first sub-board 200a, and the second adhesive layer 116 is directly connected to the second sub-board 300a. Each of the circuit patterns 217 contacts the upper surface 117 of each of the conductive blocks 118 now and is coplanar with the first adhesive layer 114. Each of the pads 312 contacts the lower surface 119 of each of the conductive blocks 118 and is coplanar with the second adhesive layer 116. The conductive blocks 118 are structurally and electrically connected to the circuit patterns 217 of the first sub-board 200a and the pads 312 of the second sub-board 300a. Manufacturing of a circuit board structure 10a is completed so far.

Structurally, with reference to FIG. 1F, the circuit board structure 10a provided by this embodiment includes the first sub-board 200a, the second sub-board 300a, and the connecting structure layer 100a. The first sub-board 200a includes the dielectric layer 212, the first circuit layer 214, the second circuit layer 216, and the conductive vias 218. The first circuit layer 214 and the second circuit layer 216 are located on two opposite sides of the dielectric layer 212. The conductive vias 218 penetrate through the dielectric layer 212 and are connected to the first circuit layer 214 and the second circuit layer 216, and the second circuit layer 216 includes the circuit patterns 217. The second sub-board 300a includes the substrate 310 and the pads 312, and the pads 312 are located on the top surface 311 of the substrate 310. The connecting structure layer 100a is disposed between the first sub-board 200a and the second sub-board 300a. The connecting structure layer 100a has the through holes 115 and includes the insulating layer 112, the first adhesive layer 114, the second adhesive layer 116, and the conductive blocks 118. The first adhesive layer 114 and the second adhesive layer 116 are located on two opposite sides of the insulating layer 112. The first adhesive layer 114 is directly connected to the dielectric layer 212 of the first sub-board 200a, and the second adhesive layer 300a is directly connected to substrate 310 of the second sub-board 300a. The through holes 115 penetrate through the first adhesive layer 114, the insulating layer 112, and the second adhesive layer 116, and the conductive blocks 118 are located in the through holes 115. The upper surface 117 and the lower surface 119 of each of the conductive blocks 118 are respectively lower than the first surface S1 of the first adhesive layer 114 relatively away from the insulating layer 112 and the second surface S2 of the second adhesive layer 116 relatively away from the insulating layer 112. Each of the circuit patterns 217 contacts the upper surface 117 of each of the conductive blocks 118, and each of the pads 312 contacts the lower surface 119 of each of the conductive blocks 118. Preferably, the height H of each of the conductive blocks 118 is equal to or greater than the thickness T of the insulating layer 112.

In other words, the first adhesive layer 114 of the connecting structure layer 100a may be directly connected to the first sub-board 200a including the circuit patterns 217, the second adhesive layer 116 of the connecting structure layer 100a may be directly connected to the second sub-board 300a including the pads 312, and two opposite sides of the conductive blocks 118 of the connecting structure layer 110a may contact the circuit patterns 217 and the pads 312. That is, through the structure in which the first adhesive layer 114 and the second adhesive layer 116 of the connecting structure layer 100a are connected to different types of sub-boards, manufacturing of a heterogeneous substrate (i.e., the circuit board structure 10a) is completed. In this way, in the manufacturing method of the circuit board structure 10a provided by the present embodiment, neither solder nor underfill is required, so manufacturing costs of the circuit board structure 10a may be effectively reduced. Besides, connection is made through the adhesive layers since no solder is used, as such, bonding yields between the connecting structure layer 100a and the first sub-board 200a and the second sub-board 300a may be effectively increased, a simple process is provided, and structural reliability of the circuit board structure 10a provided by the present embodiment is improved.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 2:
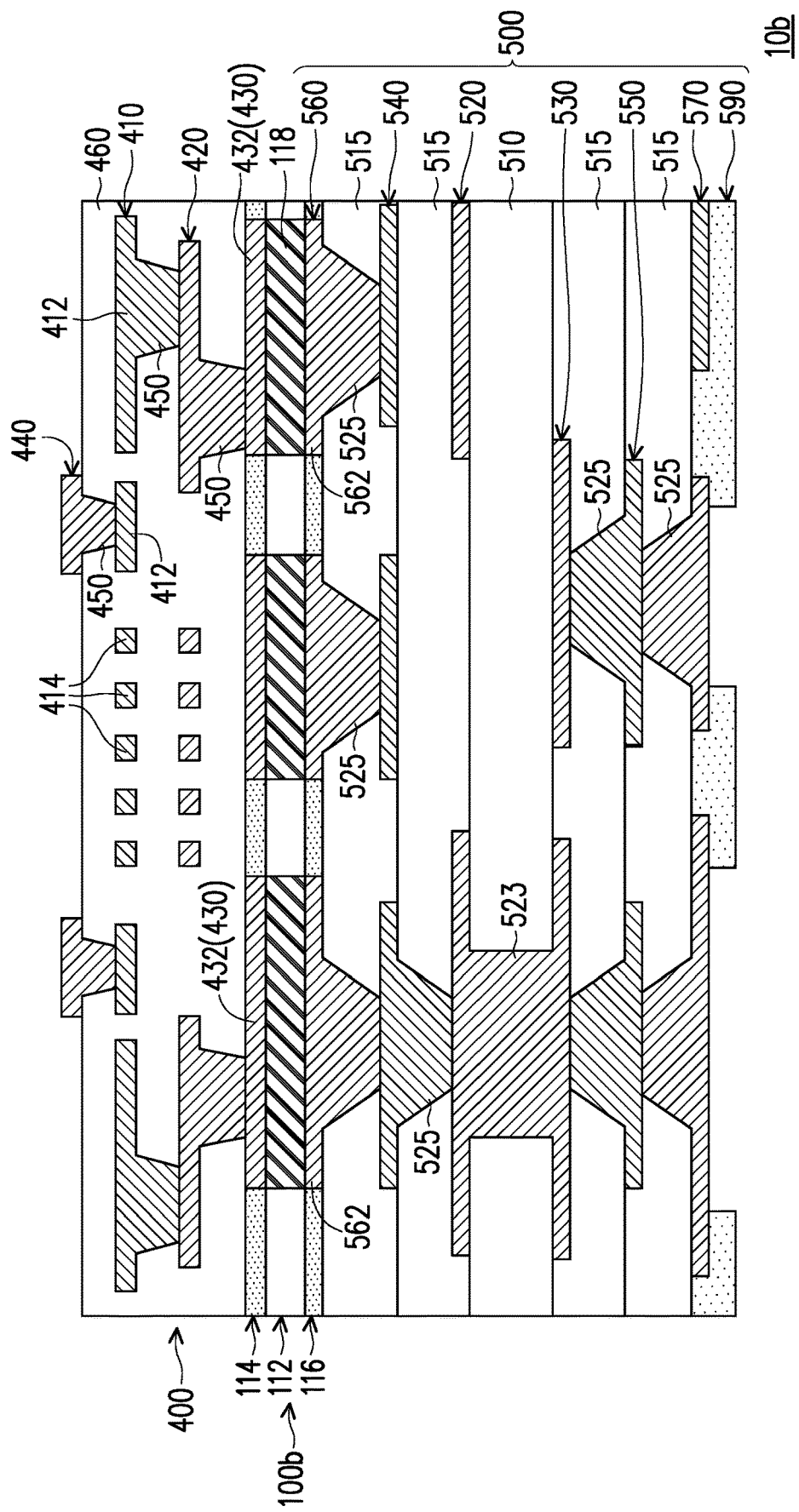
FIG. 2 is a cross-sectional schematic view of a circuit board structure according to another embodiment of the disclosure.

FIG. 2 is a cross-sectional schematic view of a circuit board structure according to another embodiment of the disclosure. With reference to FIG. 1F and FIG. 2 together first, a circuit board structure 10b provided by the present embodiment and the circuit board structure 10a described above are similar, and differences therebetween are that: a connecting structure layer 100b in this embodiment has three conductive blocks 118 only, and structures of a first sub-board 400 and a second sub-board 500 are different from that of the first sub-board 200a and the second sub-board 300a.

The first sub-board 400 provided by this embodiment may be implemented as a redistribution circuit board having thin circuits. To be specific, the first sub-board 400 includes a plurality of dielectric layers 460, a plurality of circuit layers 410, 420, 430, and 440, and a plurality of conductive vias 450. The circuit layers 410, 420, 430, and 440 and the dielectric layers 460 are stacked in an alternating manner, and the conductive vias 450 penetrate through the dielectric layers 460 and are connected to the circuit layers 410, 420, 430, and 440. The circuit layer 430 relatively adjacent to the connecting structure layer 100b includes a circuit pattern 432, and the circuit layers 410 and 420 include a general circuit 412 and a plurality of fine circuits 414.

Further, the second sub-board 500 provided by this embodiment may be implemented as a multilayer circuit board. The second sub-board 500 includes a plurality of circuit layers 520, 530, 540, 550, 560, and 570, a plurality of dielectric layers 510 and 515, and a solder-mask layer 590. The circuit layers 520, 530, 540, 550, 560, and 570 and the dielectric layers 510 and 515 are arranged in an alternating manner, and the circuit layer 560 includes a pad 562. The solder-mask 590 covers and partially exposes the circuit layer 570, so that the circuit layer 570 may act as a pad to be electrically connected to an external circuit. A first conductive via 523 penetrates through the dielectric layer 510 and is electrically connected to the circuit layers 520 and 530, and a first conductive via 525 penetrates through the dielectric layer 515 and is electrically connected to the circuit layers 520 and 540, the circuit layers 540 and 560, the circuit layers 530 and 550, and the circuit layers 550 and 570.

With reference to FIG. 2 again, in the connecting structure layer 100b provided by the present embodiment, the first sub-board 400 and the second sub-board 500 are connected through the first adhesive layer 114 and the second adhesive layer 116. The circuit pattern 432 of the first sub-board 400 and the pad 562 of the second sub-board 500 are structurally and electrically connected through the conductive blocks 118 of the connecting structure layer 100b. In this way, in the circuit board structure 10b provided by the present embodiment, neither solder nor underfill is required, so manufacturing costs of the circuit board structure 10b may be effectively reduced, bonding yields between the connecting structure layer 100b and the first sub-board 400 and the second sub-board 500 may be effectively increased, and structural reliability of the circuit board structure 10b is improved.

Note that the connecting structure layers 100a and 100b provided by the present embodiment may be designed differently according to different product needs, for instance, the number, sizes, heights, and positions of the conductive blocks 118 may be appropriately adjusted so that the conductive blocks 118 may be considerably matched and may exhibit high use efficiency.

In view of the foregoing, in the circuit board structure design provided by the disclosure, the first adhesive layer of the connecting structure layer may be directly connected to the first sub-board including plural circuit patterns, the second adhesive layer of the connecting structure layer may be directly connected to the second sub-board including plural pads, and two opposite sides of the conductive blocks of the connecting structure layer may contact the circuit patterns and the pads. In this way, in the manufacturing method of the circuit board structure provided by the disclosure, neither solder nor underfill is required, so manufacturing costs of the circuit board structure may be effectively reduced. Besides, because the adhesive layers are used to replace the use of solder, the bonding yields between the connecting structure layer and the first sub-board and the second sub-board may be effectively increased, a simple process is provided, and structural reliability of the circuit board structure provided by the disclosure is improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit board structure, comprising:
a first sub-board, comprising a plurality of circuit patterns, and a plurality of conductive vias;
a second sub-board, comprising a plurality of pads; and
a connecting structure layer, disposed between the first sub-board and the second sub-board, wherein the connecting structure layer has a plurality of through holes and comprises an insulating layer, a first adhesive layer, a second adhesive layer, and a plurality of conductive blocks, the first adhesive layer and the second adhesive layer are located on two opposite sides of the insulating layer, the first adhesive layer is directly connected to the first sub-board, the second adhesive layer is directly connected to the second sub-board, the through holes penetrate through the first adhesive layer, the insulating layer, and the second adhesive layer, and the conductive blocks are located in the through holes, wherein a diameter of each of the through holes is constant, each of the conductive blocks has an upper surface and a lower surface opposite to each other, the upper surface is lower than a first surface of the first adhesive layer relatively away from the insulating layer and the lower surface is higher than a second surface of the second adhesive layer relatively away from the insulating layer, each of the circuit patterns directly contacts the upper surface of each of the conductive blocks and has the same diameter as each of the conductive blocks, and a portion of the circuit patterns are located between the conductive vias and the conductive blocks, and each of the pads contacts the lower surface of each of the conductive blocks and has the same diameter as each of the conductive blocks.

2. The circuit board structure according to claim 1, wherein a height of each of the conductive blocks is equal to or greater than a thickness of the insulating layer.

3. The circuit board structure according to claim 1, wherein the first sub-board comprises a dielectric layer, a first circuit layer, and a second circuit layer, the first circuit layer and the second circuit layer are located on two opposite sides of the dielectric layer, the conductive vias penetrate through the dielectric layer and are connected to the first circuit layer and the second circuit layer, and the second circuit layer comprises the circuit patterns.

4. The circuit board structure according to claim 1, wherein the first sub-board comprises a plurality of dielectric layers, and a plurality of circuit layers, the circuit layers and the dielectric layers are stacked in an alternating manner, the conductive vias penetrate the dielectric layers and are connected to the circuit layers, one layer among the circuit layers relatively adjacent to the connecting structure layer comprises the circuit patterns, and at least one layer among the circuit layers comprises a plurality of fine circuits.

5. The circuit board structure according to claim 1, wherein the second sub-board further comprises a substrate, and the pads are located on a top surface of the substrate.

6. The circuit board structure according to claim 5, wherein the substrate comprises a printed circuit board, a bismaleimide-triazine carrier board, a ceramic substrate, a redistribution layer carrier board, or a glass substrate.

* * * * *